United States Patent [19]

Ferri et al.

[11] 4,389,272

[45] Jun. 21, 1983

[54] PROCESS AND FEEDING DEVICE TO PROVIDE CONSECUTIVE SERIES OF SMALL OBJECTS ON A SINGLE PLANE

[75] Inventors: Beniamino Ferri, Monza; Giovanni Caimi, Saronno, both of Italy

[73] Assignee: Ferco S.p.A., Misinto, Italy

[21] Appl. No.: 285,558

[22] Filed: Jul. 21, 1981

[30] Foreign Application Priority Data

Jul. 22, 1980 [IT] Italy .............................. 23593 A/80

[51] Int. Cl.³ ..................... B65G 59/02; H05K 13/02
[52] U.S. Cl. .................................. 156/297; 156/556; 156/566; 29/740; 29/809; 29/832; 221/93; 221/94; 221/251; 414/118
[58] Field of Search ............... 156/297, 299, 556, 561, 156/562, 566; 29/738, 740, 741, 832, 840, 809; 221/210, 211, 232, 220, 251, 93, 94, 264; 312/60; 414/99, 118, 119; 271/9, 160

[56] References Cited

U.S. PATENT DOCUMENTS

| | | | |
|---|---|---|---|
| 3,963,456 | 6/1976 | Tsuchiya et al. | 221/264 |
| 4,070,229 | 1/1978 | Hentz et al. | 156/556 |
| 4,099,324 | 7/1978 | Johnson et al. | 29/739 |
| 4,127,432 | 11/1978 | Kuwano et al. | 156/562 |
| 4,292,116 | 9/1981 | Takashashi | 156/297 |

FOREIGN PATENT DOCUMENTS

| | | | |
|---|---|---|---|
| 1211536 | 2/1966 | Fed. Rep. of Germany | 156/562 |
| 974261 | 11/1964 | United Kingdom | 156/562 |
| 2086865 | 5/1982 | United Kingdom | 29/740 |

OTHER PUBLICATIONS

New Automated Mounting Equipment Handles Cylindrical Chip Capacitors, Shirouchi, H., *JEE*, vol. 16, No. 154, 10/79, pp. 32-36.

*Primary Examiner*—Edward C. Kimlin
*Assistant Examiner*—F. K. Wine
*Attorney, Agent, or Firm*—Fleit, Jacobson & Cohn

[57] ABSTRACT

Process and relative feeding device to provide small objects on a single plane, according to which in a series of magazines holding the stacked objects of different thicknesses and tolerances a differentiated operation pusher by adjustable stroke is caused to act upon one end of each of the magazines, whereas at the same time the opposite ends or free top openings of the magazines are closed by a stop device, the objects thus moving against the device; then moving the latter away from the openings and contacting the aligned external surface of the objects with the planar surface onto which the objects will be applied.

2 Claims, 6 Drawing Figures

PROCESS AND FEEDING DEVICE TO PROVIDE CONSECUTIVE SERIES OF SMALL OBJECTS ON A SINGLE PLANE

This invention relates to the feeding of objects of small sizes of difficult manual handling such as, for example, chip type electronic components, MELFs, SOTs and integrated circuits provided with pins, which are stacked in magazines arranged parallel to one another, from which successive series of objects are withdrawn and then placed on a planar surface making up, for example, a printed circuit board.

Now, it should be specified that by successive series of objects it is here meant the simultaneous feeding of objects, each of which contained within its respective stack, that is the feeding of as many different objects as the stacks making up the magazines.

Several systems have been designed, but hitherto no approach has succeeded in providing a single plane which is identical for each successive series of objects, independently both of the rated thickness and tolerances of said objects. The prior art attempts just aimed to provide identical withdrawal planes for each series of objects. This approach does not solve the problem of laying down withdrawn objects when their thickness is not the same, particularly in case the laying down plane is not coincident with the withdrawal plane.

Therefore, it is the object of the present invention to provide a process and relative device to feed a successive series of objects having a nearly parallelopiped shape, by means of which said objects are supplied onto a single common plane which will then be the laying down plane, or a plane parallel thereto.

The foregoing object has been accomplished by providing that in a series of magazines holding the stacked objects of different thicknesses and tolerances, a differentiated operation pusher by self-adjustable stroke is caused to act upon one end of each of said magazines, while at the same time the opposite ends or free top openings of the magazines are closed by a stop device, said objects thus moving against said stop device; then moving said device away and contacting the aligned external surface of said objects with the planar surface onto which said objects will be applied.

A further embodiment of the invention provides that the stop device creating the predetermined plane comprises a grate having flat portions at the free top openings of each magazine, said grate being movable from the closing position for said free openings to a position intermediate between said openings to feed the objects arranged at said free openings.

A solution also provides that the pusher comprises a rod operated by a resilient means.

According to another embodiment of the present invention, the stop device is provided with seats for receiving the objects displaced by the pusher.

A solution provides that the pusher comprises a rod movable with respect to a friction device. Particular embodiments of these friction devices include a conical bushing, provided with longitudinal slots, which is closed to larger or less extension, and a cylindrical bushing which is more or less compressed.

A particular solution provides that the stop device comprises pliers means.

The invention will now be further explained with reference to exemplary embodiments as shown in the accompanying drawings, in which.

Figure 1:
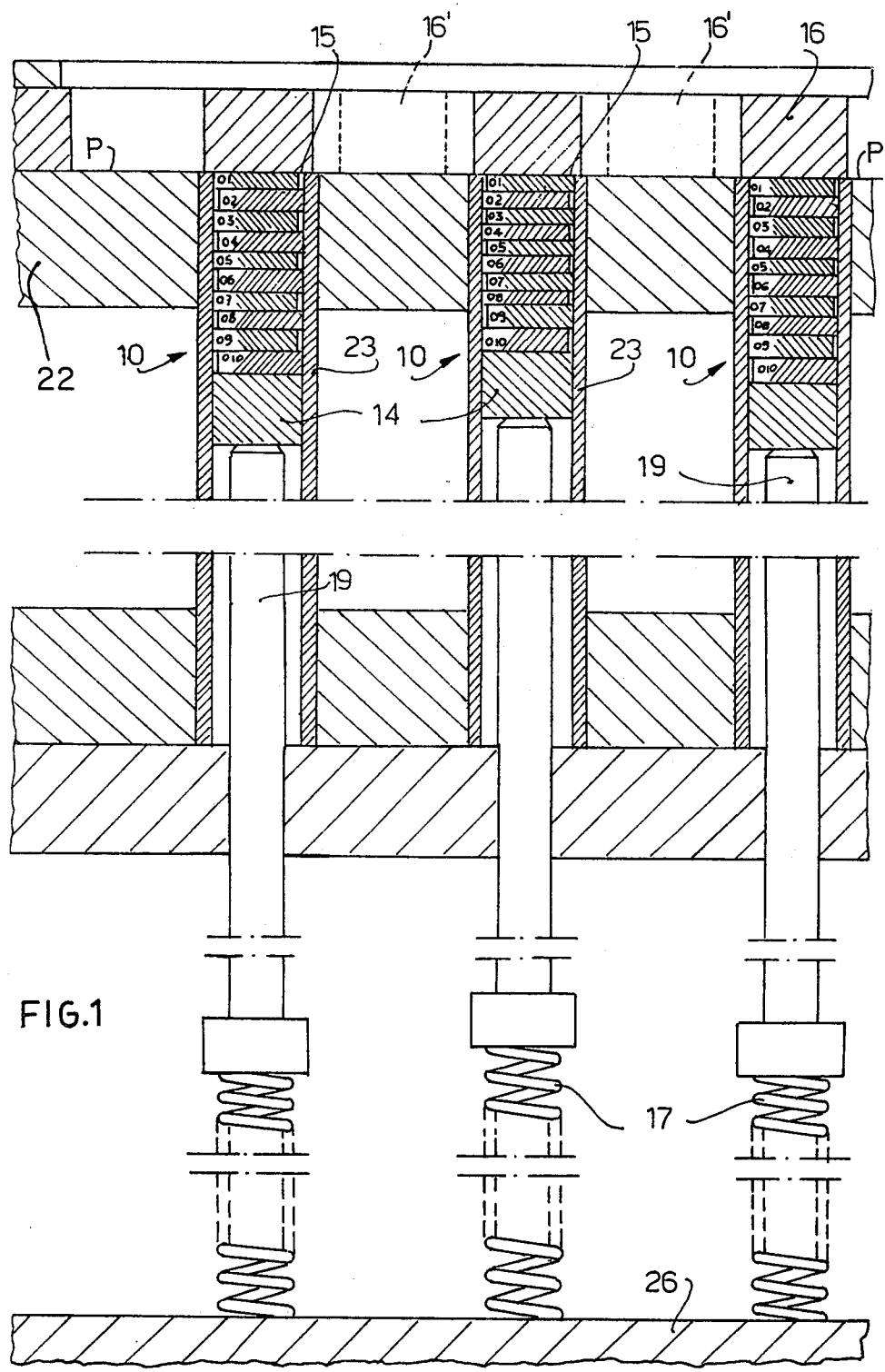
FIG. 1 is a sectional view showing a portion of the feeding unit, particularly comprising three stacks of objects.

In FIG. 1 there is shown a support 22 for magazines 23, each of which containing a stack 10 of objects, such as 01, 02,–,010. In this case the laying down plane is coincident with the withdrawal plane. As it will be seen in the drawings, these objects contained in the same stack, have different thicknesses and different thickness tolerances. At each withdrawal of a series of objects, a predetermined displacement for recovering the thickness of the missing object would significantly offset the final plane for the objects, since even minimal differences with respect to the rated value would sum up. It would also be impossible to take into account the object thickness tolerances, which are quite unexpected and could either add or subtract from the previously specified error.

According to the present invention, stacks 10 of objects are pushed towards the free top opening 15 by a pusher 19, which is driven by an operating plate 26 through springs 17.

Each of the magazines 23 containing the object stacks 10 has a free top opening 15, at which a stop gate 16 is provided, creating with its bottom surface a single stop surface for all of the object stacks 10. This plane is shown by line P-P and coincides with the laying down plane of the objects, as disclosed in the following.

The stop gate 16 will be such as to move from the position shown by full line to the position shown by dashed line, in which a full portion of the grate will be between two top openings 15.

The stop device can be provided, in addition to the stop grate 16, also with a full plate which will be then moved away, clearing the whole plane P-P containing the free openings 15 of the magazines.

The operation of the device according to the present invention is as follows: when at least some of the magazines 23 are filled with objects, 01, 02, 03,–, 010, the stop grate 16 is positioned at the free top openings 15. The operating plate 26 is operated which, through said springs 17, urges the pushers 19, operating through stoppers 14, against the object stacks 10, so that all of the objects 01 will press by the external surfaces thereof against the stop grate 16. Therefore, the external surfaces of all of the objects 01 will lie on the plane P-P, which will make up a single plane.

Now, the stop grate 16 is moved to the position 16', which has been shown by dashed line, so that said openings are now free and the respective objects 01 can be withdrawn, so that the surfaces thereof contained in said plane P-P adhere against the planar surface onto which said objects will be applied. Next, all the objects 02 will be caused to press against the stop device and will then be fed as above described for the objects 01, and so on.

Figure 2:
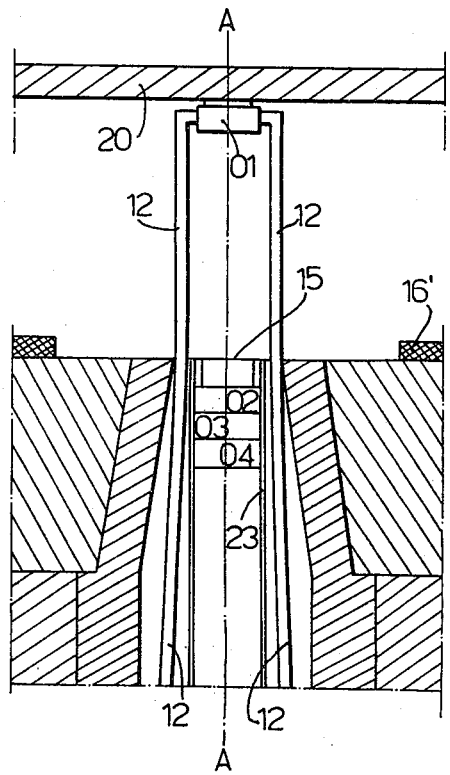
FIG. 2 is a sectional view showing a single magazine provided with a withdrawal device for using the plane as created by the stop device.

The application of the aligned objects on the reception surface therefore can be carried out, for example as shown in FIG. 2, by means of pliers 12 displacing said plane P-P parellely to itself, so as to contact the planar surface of board 20.

A second embodiment of the present invention is concerned with the case where the laying down plane is not coincident with the outwardly facing side 44 of the first objects 01 of the stacks 10 located at the free top opening 15 of the magazines 23, but with the side 45 opposite to the outwardly facing side.

This leads to further problems, in addition to that previously pointed out relating to the different tolerances of the objects having a same rated thickness. Indeed, it is required to compensate for the difference in thickness of the various objects just as the latter are being aligned on a same plane.

Figure 3:
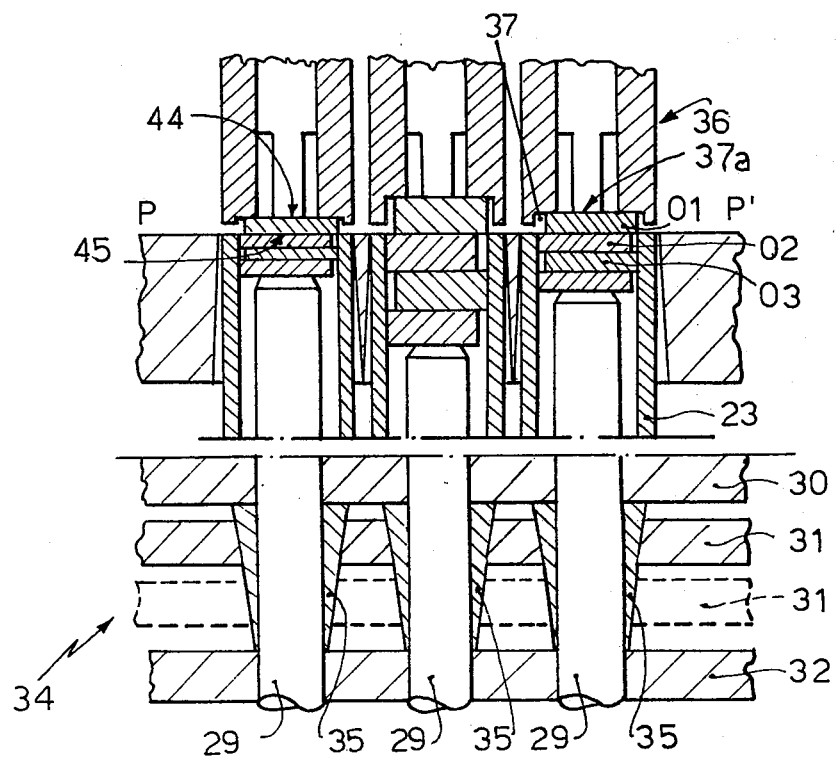
FIGS. 3 and 4 show a second embodiment of a device according to the invention, comprising an exemplary friction means for the pusher operation.

A device enabling to create a single laying down plane corresponding to the object facing side opposite to the outwardly facing side is shown in FIG. 3. This figure shows the objects 01, 02, 03,–arranged in stacks 10 contained in magazines 23. The objects are urged by pusher means 29, which comprise rods, to a stop device 36 having cavities 37 therein, in which the first objects arranged on stacks 10 are inserted. Each of these cavities 37 is provided with an abutment 37a. The dimensions of cavities 37 depend on the dimensions and particularly on the thickness of the object which is to be handled, as shown in FIG. 3.

The stop device may also comprise pliers means provided with seats for withdrawing the objects and laying down the same on a single laying down plane.

The pusher means 29 insert in the friction adjusting unit 34 comprising the plates 30, 31, 32.

Figure 4:
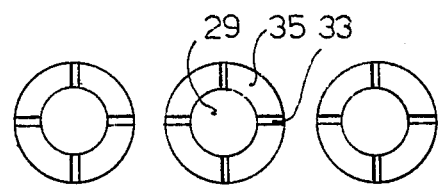

Between said pushers 29 and plate 31 friction devices are located as comprising, for example, conical bushings 35 having longitudinal slots 33 therein. An example of such a bushing 35 is shown in plan view in FIG. 4. The spacing between plate 30 and plate 32 is fixed, whereas the relative spacing thereof from plate 31 is adjustable and made fixed at the time of use depending on the amount of friction to be obtained. Said plate closes or not said conical bushing 35, thus exerting a higher or lower friction against the pushers 29, as shown in FIG. 3.

Figure 5:
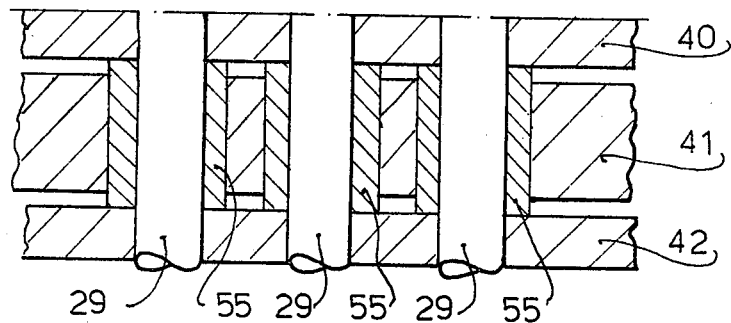
FIGS. 5 and 6 show another exemplary friction means for the pusher operation.
Figure 6:
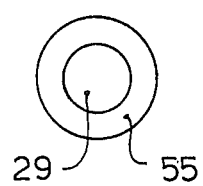

Another embodiment of the friction means is shown in FIGS. 5 and 6. This friction means comprises a cylindrical bushing 55 of resilient material surrounding pusher 29 between two plates 40 and 42. The mutual spacing between these two plates determines the amount of friction to be provided, since it compresses, and accordingly deforms said bushing 55. Plate 41 prevents the bushing deformation from occurring also outwardly of the pusher.

The operation of this second embodiment of the device is as follows: all of the magazines 23 arranged in the stack 10 are simultaneously upwardly pushed by the pushers 29. Therefore, the first objects 01 of the stacks are inserted inside the cavities 37 in the stop device 36 and are stopped by the abutments 37a. As above mentioned, said cavities 37 have been differently configurated depending on the thickness of the objects, thus providing a single plane corresponding to line P'-P' (FIG. 3) facing side 45, which is the laying down plane for said objects. Of course, the object of smallest thickness will first reach the abutment 37a and then the pusher 29 corresponding thereto (that on the leftside in FIG. 3) will slide exerting friction against the friction means, while the other pushers will similarly fit the thicknesses of the various other objects.

The present invention envisages all of the detail modifications which may become apparent to those skilled in the art.

What is claimed is:

1. A process for use with an apparatus having a plurality of magazines containing stacks of objects, the objects in a given stack having varying thicknesses, the magazines having open top ends and bottom ends closed by movable stoppers, said process comprising:

passing a pusher for each magazine through friction means comprising a conical bushing provided with a longitudinal slot, said friction means opposing movement of the pusher, an upper end of each pusher extending into a bottom end of a respective one of said magazines;

moving at least one of said conical bushings with respect to its associated pusher to thereby adjust the force exerted on said associated pusher by said friction means to thereby independently control the stroke of said associated pusher;

moving an operating plate so as to exert an upward force on the pushers whereby the pushers move the stoppers in an upward direction, the adjustment of the friction means controlling the amount of movement of the stoppers; and positioning a stop device at the open top ends of the magazines to close the open top ends and to mechanically resist upward movement of the objects by upward movement of the stoppers so as to create a common plane for like surfaces of the objects.

2. A process according to claim 1, wherein said stop device comprises a plate having a lower surface positionable so as to close the open top ends of said magazines, said stop device being positioned so the lower surface thereof closes the top ends of said magazines so that upper surfaces of the objects contact the plate thereby stopping upward movement of the objects whereby upper surfaces of the objects are positioned in a common place, said process further comprising:

moving said plate with respect to said magazines from its position closing the open top ends so as to provide access to said magazines;

removing top objects from said magazines;

transferring the removed objects to a reception surface forming a common laying down plane for the objects;

and adhering the objects to the reception surface.

* * * * *